(12) United States Patent
Matsushita

(10) Patent No.: US 7,787,510 B2
(45) Date of Patent: Aug. 31, 2010

(54) NITRIDE SEMICONDUCTOR LASER CHIP, NITRIDE SEMICONDUCTOR LASER DEVICE, AND MANUFACTURING METHOD OF NITRIDE SEMICONDUCTOR LASER CHIP

(75) Inventor: Yasuhiko Matsushita, Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 5 days.

(21) Appl. No.: 12/353,386

(22) Filed: Jan. 14, 2009

(65) Prior Publication Data

US 2009/0180507 A1 Jul. 16, 2009

(30) Foreign Application Priority Data

Jan. 16, 2008 (JP) ............................ 2008-006762

(51) Int. Cl.
*H01S 5/00* (2006.01)
*H01L 31/00* (2006.01)

(52) U.S. Cl. .............................. 372/45.011; 372/43.01; 372/44.011; 257/14

(58) Field of Classification Search ............. 372/43.01, 372/45.011, 44.011
See application file for complete search history.

(56) References Cited

U.S. PATENT DOCUMENTS

| | | | |
|---|---|---|---|
| 7,397,834 B2* | 7/2008 | Kozaki et al. .......... | 372/46.012 |
| 2001/0021209 A1* | 9/2001 | Onishi ........................ | 372/43 |
| 2005/0025204 A1* | 2/2005 | Kamikawa et al. ............ | 372/43 |
| 2005/0048682 A1* | 3/2005 | Takatani et al. ............... | 438/22 |
| 2005/0082550 A1* | 4/2005 | Hamaoka et al. .............. | 257/80 |
| 2005/0141577 A1* | 6/2005 | Ueta et al. .................... | 372/43 |
| 2006/0202188 A1* | 9/2006 | Ueta et al. .................... | 257/14 |
| 2007/0121692 A1* | 5/2007 | Kawakami et al. ....... | 372/43.01 |
| 2007/0221932 A1* | 9/2007 | Kano et al. ................... | 257/96 |
| 2008/0181276 A1* | 7/2008 | Kawanaka et al. ..... | 372/45.013 |

FOREIGN PATENT DOCUMENTS

JP 2007-273901 A 10/2007

\* cited by examiner

*Primary Examiner*—Minsun Harvey
*Assistant Examiner*—Phillip Nguyen
(74) *Attorney, Agent, or Firm*—Marvin A. Motsenbocker; Mots Law, PLLC

(57) ABSTRACT

Provided are a nitride semiconductor laser chip with a reliability improved by relieving stress due to strain within the nitride semiconductor laser chip, a manufacturing method thereof, and a nitride semiconductor laser device. The nitride semiconductor laser chip comprises: a substrate; and a laminated structure provided on a main surface of the substrate and including a nitride semiconductor layer. In the laminated structure, at least one crack parallel to a resonator end face is formed. By forming a crack within a laser chip, stress due to strain is relieved; therefore, it is possible to obtain a laser chip having a high reliability.

20 Claims, 6 Drawing Sheets

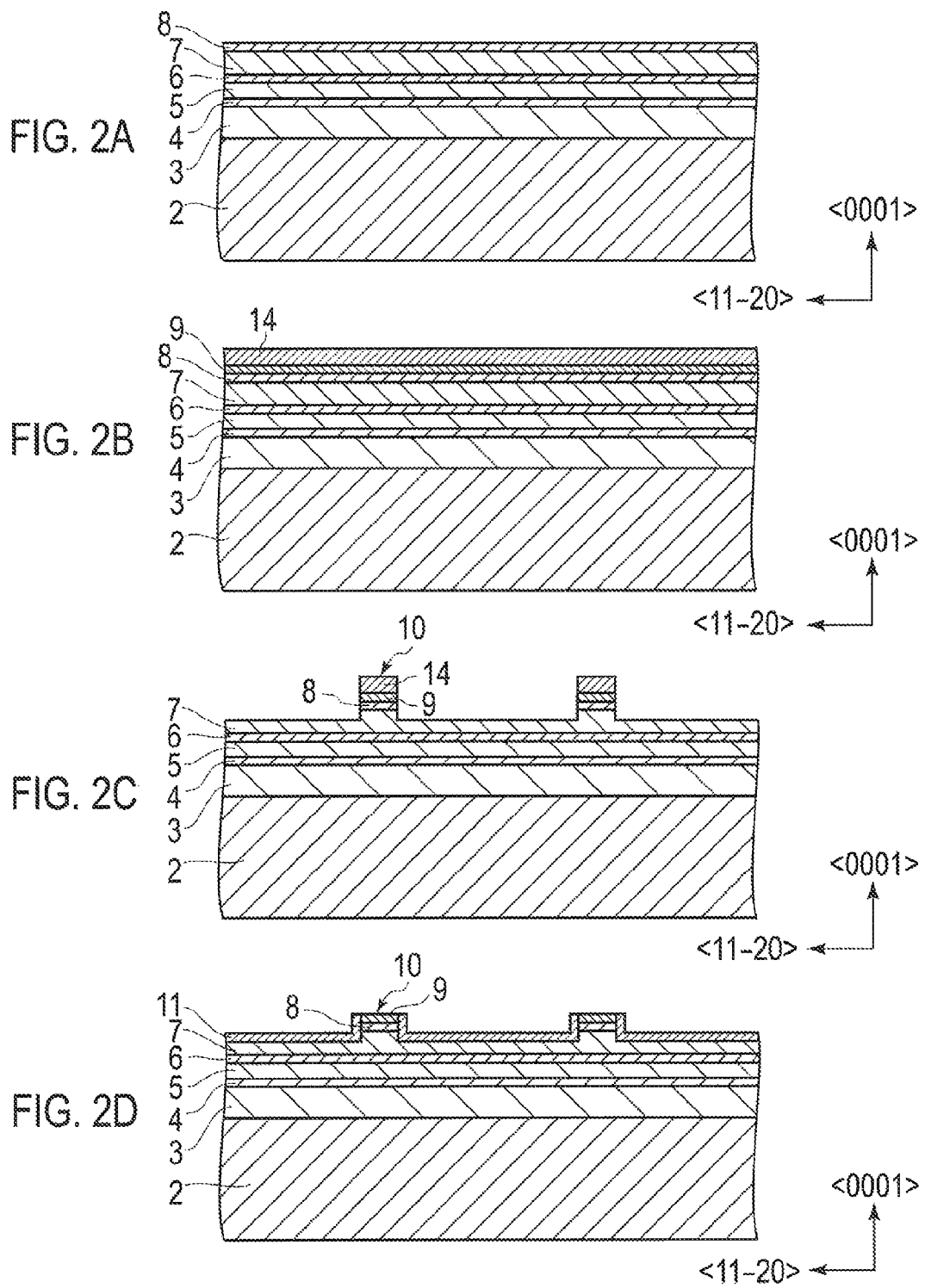

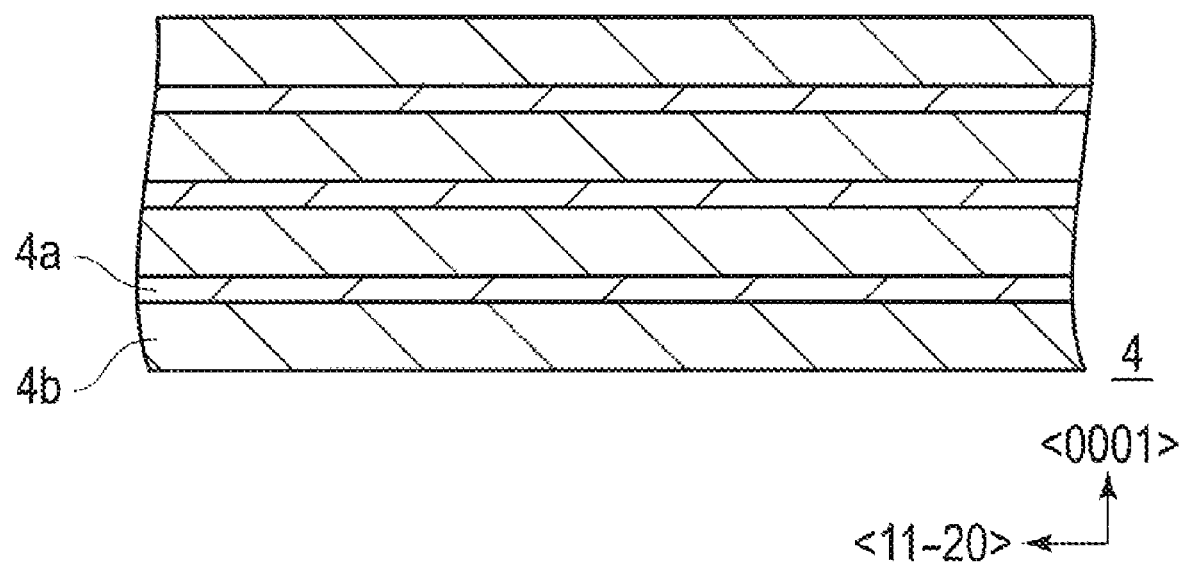

NITRIDE SEMICONDUCTOR LASER CHIP, NITRIDE SEMICONDUCTOR LASER DEVICE, AND MANUFACTURING METHOD OF NITRIDE SEMICONDUCTOR LASER CHIP

CROSS REFERENCE TO RELATED APPLICATIONS

This application claims priority based on 35 USC 119 from prior Japanese Patent Application No. P2008-6762 filed on Jan. 16, 2008, entitled "Nitride Semiconductor laser Chip, Nitride Semiconductor Laser Device, and Manufacturing Method of Nitride Semiconductor Laser Chip", the entire contents of which are incorporated herein by reference.

BACKGROUND OF THE INVENTION

1. Field of the Invention

The present invention relates to a nitride semiconductor laser chip and a nitride semiconductor laser device equipped with the nitride semiconductor laser chip. The present invention also relates to a manufacturing method of a nitride semiconductor laser chip.

2. Description of Related Art

A nitride semiconductor containing a group III element and a group V element, which is a so-called group III-V semiconductor (for example, AlN, GaN, InN, AlGaN, InGaN, and the like) is expected to be used as a light-emitting device that emits blue or blue-violet light because of the band structure, and has already been used for a light emitting diode and a laser device.

For example, a nitride semiconductor laser chip has been obtained that has an active layer having a multiple quantum well structure formed by alternately stacking GaN (including the case of containing a trace amount of In) and InGaN layers, and such a chip has been used in various devices because of its stability of light emission (refer to Japanese Patent Application Publication No. 2007-273901)

However, such a nitride semiconductor laser chip has a problem that lattice mismatch occurs between the GaN and InGaN layers. This is attributed to the fact that InGaN is a mixed crystal of GaN (having an a-axis length of 3.16 Å) and InN (having an a-axis length of 3.54 Å), which both have a wurtzite structure but have different lattice constants. Accordingly, when the GaN and InGaN layers are grown in the <0001> axis direction, the active layer suffers from crystal lattice mismatch depending on a composition ratio of In in InGaN. In such a case, stress due to strain introduced to the crystal is increased, and various problems arise, such as a problem of spatial separation of an electron and a hole by a piezoelectric field and a problem of introduction of a large amount of defects. Then, these problems promote a decrease in light-emitting characteristics and an increase in heat generation, which makes the laser device with the nitride semiconductor laser chip prone to break down. This consequently leads to a problem of decreasing the reliability of the laser device. Furthermore, there may also arise the same problem of lattice mismatch not only in the active layer but also in other layer (for example, a layer using AlGaN or the like).

SUMMARY OF THE INVENTION

An aspect of the invention provides a nitride semiconductor laser chip that comprises: a substrate; a laminated structure provided on a main surface of the substrate and including a nitride semiconductor layer; and at least one crack in the laminated structure.

Furthermore, in a nitride semiconductor laser chip having the above-described configuration, the crack may have a flat plate-like shape perpendicular to the main surface of the substrate, and may be formed so as to reach from one end part of the laminated structure to the other end part thereof.

Furthermore, in a nitride semiconductor laser chip having the above-described configuration, the crack may be provided so as to be substantially perpendicular to directions in which light generated within the laminated structure reciprocates.

By having such a configuration, it is possible to prevent that light generated by causing laser oscillation is refracted or reflected by the crack. Accordingly, it is possible to prevent a decrease in light output and further improve the reliability.

Furthermore, a nitride semiconductor laser chip having the above-described configuration may include one or two cracks.

Such a configuration allows the reliability of the nitride semiconductor laser to be more reliably and effectively improved by the crack formation. In other words, by including one or two cracks, the nitride semiconductor laser chip is allowed to have a higher reliability than a similar laser chip having no crack formed therein.

Furthermore, in a nitride semiconductor laser chip having the above-described configuration, the laminated structure may include an Al-doped layer made essentially of AlGaN, and an Al composition of the Al-doped layer may be in a range from 6% to 8%, inclusive. Furthermore, the thickness of the laminated structure in a direction perpendicular to the main surface of the substrate may be in a range from 2 μm to 6 μm, inclusive.

By having such a configuration, a crack can be efficiently formed by forming the laminated structure on the substrate. Accordingly, no special process for the introduction of crack is required, and it is possible to form a crack easily.

Furthermore, by having such a configuration, without especially requiring a process to form a crack, a crack can be formed when the laminated structure is formed. Therefore, without increasing the number of processes, it is possible to easily obtain a nitride semiconductor laser chip having an improved reliability.

Another aspect of the invention provides a nitride semiconductor laser device that comprises: a laser chip comprising: a substrate; a laminated structure provided on a main surface of the substrate and including a nitride semiconductor layer; an electrode electrically connected to the laminated structure; and at least one crack in the laminated structure; a mount unit electrically connected to the laser chip and fixing the laser chip; a first wire electrically connected to the electrode; and a second wire electrically connected to the mount unit.

In a nitride semiconductor laser chip described above, with a structure in which a crack is formed in a laminated structure, it is possible to relieve stress due to strain of crystal lattice. Therefore, it is possible to increase the reliability of the nitride semiconductor laser chip compared to a nitride semiconductor laser chip having no crack formed therein.

BRIEF DESCRIPTION OF THE DRAWINGS

FIG. 2A, FIG. 2B, FIG. 2C, and FIG. 2D are schematic cross-sectional views illustrating an example of a manufacturing method of a wafer.

FIG. 3 is a schematic cross-sectional view illustrating a structure of an active layer.

DETAILED DESCRIPTION OF EMBODIMENTS

A nitride semiconductor laser chip, a nitride semiconductor laser device, and a manufacturing method of a nitride semiconductor laser chip according to embodiments of the present invention are described in more detail. However, the present invention is not limited to the following embodiments and can be appropriately changed without departing from spirit and scope of the invention.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

<Configuration of a Laser Chip>

Firstly, a configuration of a nitride semiconductor laser chip of an embodiment described with reference to FIG. 1A and FIG. 1B. Here, FIG. 1A shows a schematic plan view of a nitride semiconductor laser chip of an embodiment, and FIG. 1B shows a schematic cross-sectional view illustrating a section taken along line A-A of FIG. 1A.

Figure 1A:
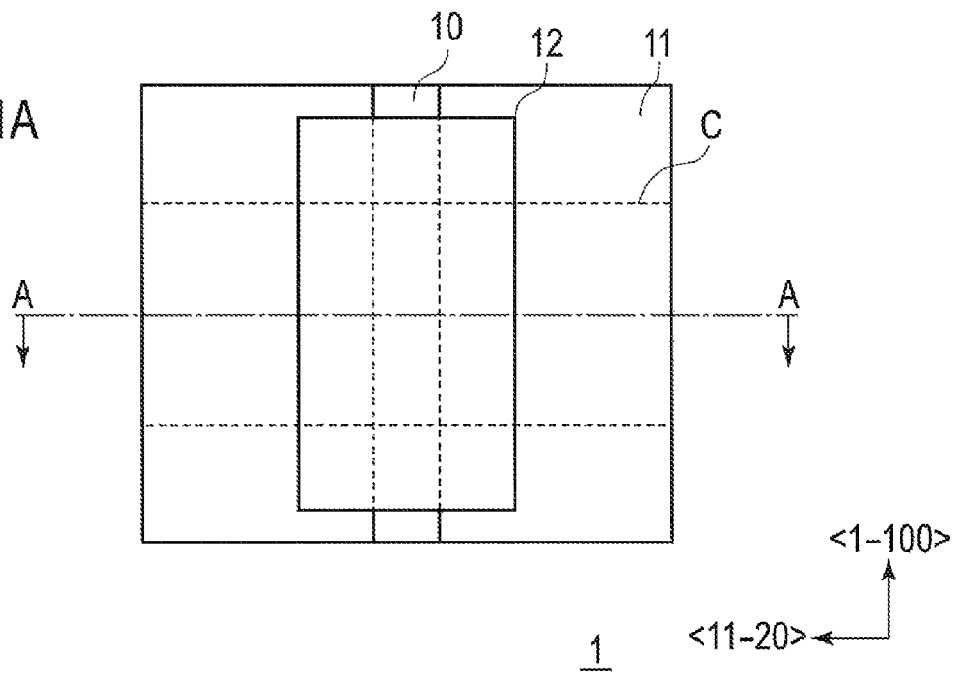
FIG. 1A and FIG. 1B are a schematic plan view and a schematic cross-sectional view, respectively, illustrating a structure of a nitride semiconductor laser chip in an embodiment.
Figure 1B:
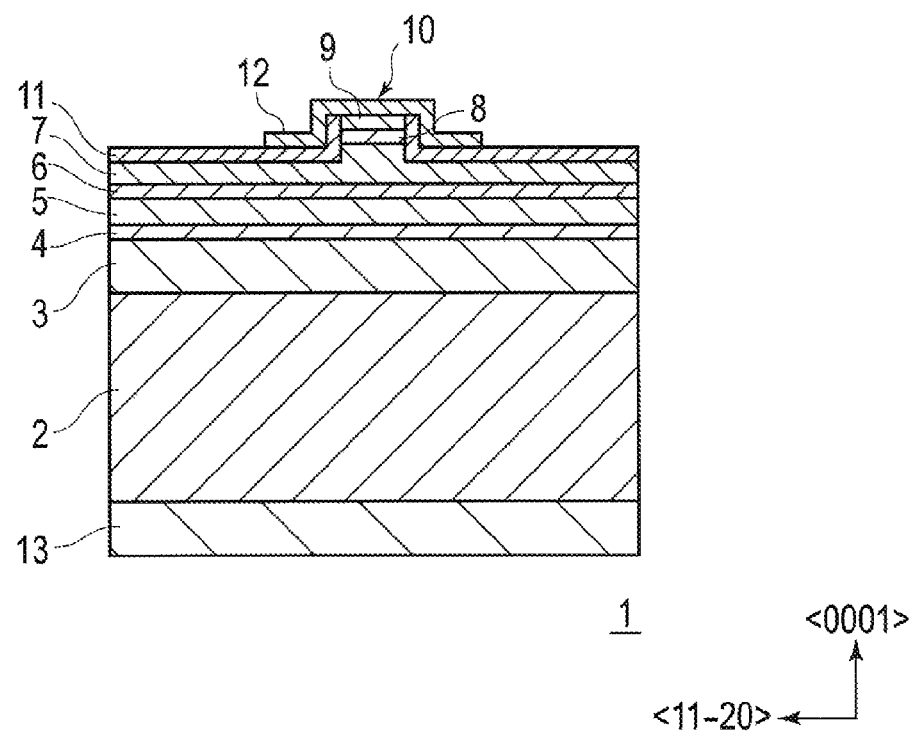

As shown in FIG. 1A and FIG. 1B, laser chip 1 of the embodiment has individual layers including: n-type cladding layer 3; active layer 4; light guide layer 5; cap layer 6; p-type cladding layer 7; and contact layer 8 that are stacked on {0001} surface of substrate 2 from the bottom to the top. These individual layers are stacked by epitaxial growth, and, in the case of the example, crystals grow that inherit the orientation relationship of respective underlying crystals. Note that, in the case where a description is given by using a crystalline orientation relationship hereinafter, the orientation relationship refers to the orientation relationship of these crystals.

Furthermore, a part of p-type cladding layer 7 projects in a direction substantially parallel to <0001> direction, and the projecting part extends in a direction substantially parallel to <1-100> direction. Meanwhile, contact layer 8 is provided in an upper surface of the projecting part of p-type cladding layer 7, and ohmic electrode 9 is formed on an upper surface of contact layer 8. Then, these projecting parts serve as an electric current passage (ridge part 10). Furthermore, on an upper surface of a non-projecting part of p-type cladding layer 7, that is, a part other than ridge part 10, electric current block layer 11 is formed.

On an upper surface of ridge part 10 and a part of an upper surface of electric current block layer 11, pad electrode 12 is formed. On a lower surface of substrate 2, n-side electrode 13 is formed. In the meantime, although not illustrated in the drawing, a protection film is formed on a resonator end face (an end face substantially perpendicular to <1-100> direction), which emits or reflects light.

Furthermore, in laser chip 1 of the present embodiment, crack C is formed, which has a surface substantially perpendicular to <1-100> direction. In other words, crack C has a flat plate-like shape, which extends in a direction substantially parallel to <11-20> direction and in a direction substantially parallel to <0001> direction. Here, FIG. 1A shows the case where two cracks C are formed in laser chip 1. In this case, each crack C is formed over the layers 3 to 8, which are each made essentially of a nitride semiconductor. The detail of the configuration of each crack C is described later.

Here, FIG. 1A and FIG. 1B each show a structure in which a part of ridge part 10 is covered by pad electrode 12 and ridge part 10 located in the vicinity of the resonator end face is not covered. However, a structure may be alternatively employed in which the entire ridge part 10 is covered. Still alternatively, a structure may be employed in which a reflectivity of a protection film formed on an end face of a reflective side is higher than a reflectivity of a protection film formed on an end face of an emission side, where the protection film is supposedly made essentially of, for example, $SiO_2$, $TiO_2$, $Al_2O_3$, AlN, $ZrO_2$ or the like.

<Manufacturing Method of a Laser Chip>

(Manufacturing Method of a Wafer)

Next, a manufacturing method of a laser chip is described with reference to drawings. Firstly, by referring to FIG. 2A, FIG. 2B, FIG. 2C, and FIG. 2D, an example of a manufacturing method of a wafer for manufacturing a nitride semiconductor laser chip of an embodiment of the present invention is described. FIG. 2A, FIG. 2B, FIG. 2C, and FIG. 2D are schematic cross-sectional views illustrating an example of a manufacturing method of a wafer, and show the same cross section as the cross section of the laser chip illustrated in FIG. 1.

Firstly, as shown in FIG. 2A, an n-type GaN substrate having a thickness of approximately 100 μm is manufactured by using {0001} surface as a growth surface (main surface). Then, on {0001} surface of substrate 2, n-type cladding layer 3 made essentially of n-type AlGaN having a thickness of approximately 1.5 μm is stacked. Then, on an upper surface of n-type cladding layer 3, active layer 4 is stacked. Active layer 4 has, as shown in the schematic cross-sectional view illustrating the structure of an active layer in FIG. 3, a multiple quantum well structure formed by alternately stacking multiple layers of well layer 4a made essentially of undoped InGaN having a thickness of approximately 3.2 nm and barrier layer 4b made essentially of undoped GaN having a thickness of approximately 20 nm. Here, in FIG. 3, the case where three well layers 4a and four barrier layers 4b are stacked is illustrated.

Then, on active layer 4 having the multiple quantum well structure, light guide layer 5 made essentially of undoped InGaN having a thickness of approximately 75 nm is stacked, and cap layer 6 made essentially of undoped AlGaN having a thickness of approximately 20 nm is stacked on light guide layer 5. On an upper surface of cap layer 6, p-type cladding layer 7 made essentially of p-type AlGaN having a thickness of approximately 500 nm is stacked. Thereafter, on p-type cladding layer 7, contact layer 8 made essentially of undoped InGaN having a thickness of approximately 3 nm is stacked. Here, FIG. 2A illustrates the state in which the layers 3 to 8 described above are stacked on the growth surface of substrate 2.

In the meantime, a process of stacking the respective layers 3 to 8 made essentially of a nitride semiconductor is carried out by, for example, a metal organic chemical vapor deposition (MOCVD) method or the like. Then, when the individual layers 3 to 8 made essentially of a nitride semiconductor are stacked and taken out from a device, which performs the stacking operation, it is possible to observe that above-described crack C is formed. Therefore, crack C is formed during the growth process of the individual nitride semiconductor layers 3 to 8 or when a temperature is lowered so as to terminate the growth process of the individual layers 3 to 8. In either case, crack C is formed in the process of manufacturing the individual layers 3 to 8 made essentially of a nitride semiconductor.

Thereafter, on an upper surface of contact layer 8, p-side ohmic electrode 9 including a Pt layer having a thickness of approximately 1 nm and a Pd layer having a thickness of approximately 30 nm is formed, and, on p-side ohmic electrode 9, $SiO_2$ layer 14 having a thickness of approximately 230 nm is formed. By forming the individual layers as described above, the structure illustrated in FIG. 2B is obtained.

Next, the structure illustrated in FIG. 2B is subjected to etching so as to form ridge part 10. At this time, a stripe-shaped photoresist (not shown in the drawing) having a width of approximately 1.5 μm and extending in <1-100> direction is formed in a part in which ridge part 10 is to be formed. Then, etching is performed by an RIE method using $CF_4$-based gas. Consequently, only $SiO_2$ layer 14 and ohmic electrode 9, which are located in a part where the photoresist is formed remain, and $SiO_2$ layer 14 and ohmic electrode 9, which are located in a part where no photoresist is formed are removed.

Then, the photoresist is removed, and etching is performed by an RIE method using a chlorine-based gas, such as $Cl_2$ and $SiCl_4$. At this time, using $SiO_2$ layer 14 as a mask, contact layer 8 and p-type cladding layer 7, which are located in a part where no $SiO_2$ layer 14 is formed are etched. Thereafter, when a state is achieved in which approximately 80 nm of p-type cladding layer 7 is left, the etching is stopped, and $SiO2_2$ layer 14 used as a mask is removed. Consequently, a structure illustrated in FIG. 2C is obtained, which has a projecting part of p-type cladding layer 7 and ridge part 10 having contact layer 8 and ohmic electrode 8 sequentially formed on the projecting part of p-type cladding layer 7.

Next, on the structure illustrated in FIG. 2C, $SiO_2$ layer having a thickness of approximately 180 nm is formed, and a photoresist is formed on $SiO_2$ layer formed in a part other than ridge part 10. Then, etching is performed by an RIE method using a $CF_4$-based gas, and electric current block layer 11 made essentially of $SiO_2$ layer is formed by removing the $SiO_2$ layer formed on ridge part 10. As a result, a structure illustrated in FIG. 2D is obtained.

Figure 4A:
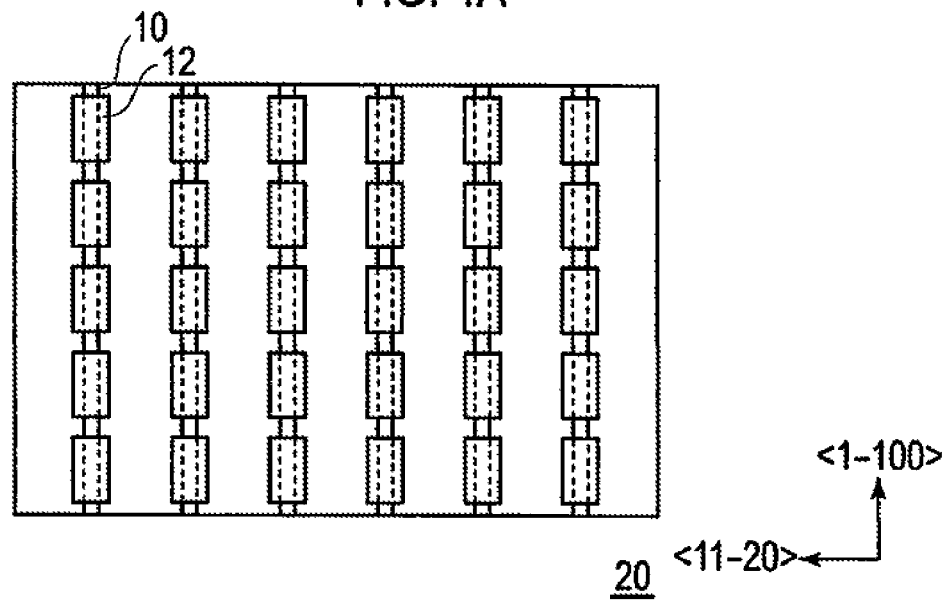
FIG. 4A and FIG. 4B are a schematic plan view and a schematic cross-sectional view, respectively, illustrating a structure of a wafer.
Figure 4B:
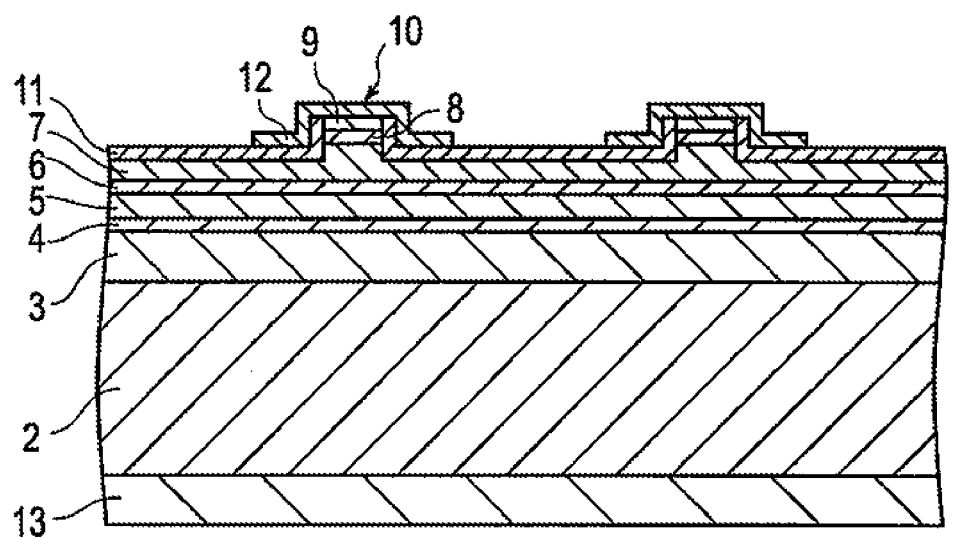

Then, to the structure illustrated in FIG. 2D, multiple pad electrodes 12 each having a thickness of approximately 3 μm are formed by sequentially forming a Ti layer having a thickness of approximately 30 nm, a Pd layer having a thickness of approximately 140 nm, and an Au layer having a thickness of approximately 2400 nm so as to cover ridge part 10 surrounded by electric current block layer 11. Then, on a surface opposite to the growth surface of substrate 2, n-side electrode 13 having a structure in which an Al layer having a thickness of approximately 6 nm, a Pd layer having a thickness of approximately 10 nm, and an Au layer having a thickness of approximately 600 nm are sequentially formed from the substrate 2 side is formed to obtain wafer 20 illustrated in FIG. 4A and FIG. 4B. FIG. 4A and FIG. 4B are a schematic plan view and a schematic cross-sectional view, respectively, illustrating the structure of the wafer. Here, the plan view illustrated in FIG. 4A shows the same planar surface as that in FIG. 1A, and the cross-sectional view illustrated in FIG. 4B shows the same cross sectional surface as that in FIG. 1B.

As illustrated in FIG. 4A and FIG. 4B, wafer 20 is provided with multiple ridge parts 10 formed thereon, and the individual ridge parts 10 extend in <1-100> direction and form together one continuous mass. Meanwhile, multiple pad electrodes 12 are formed along the respective ridge parts 10, and laser chip 1 illustrated in FIG. 1 is obtained by cleaving and dividing wafer 20. Here, as an example, the case where pad electrode 12 is divided in advance so that one pad electrode 12 is formed in every laser chip has been described; however, pad electrode 12 may be formed continuously along ridge parts 10.

Note that, in the wafer manufacturing method described above, the case where an MOCVD method is adopted for the formation of the individual layers 3 to 8 made essentially of a nitride semiconductor has been described as an example; however, a molecular beam epitaxy (MBE) method, a hybrid vapor phase epitaxy method (HVPE), or other method may be adopted. In the meantime, for the formation of individual electrode layers 9, 12, and 13, a forming method, such as sputtering and deposition, may be adopted. For deposition, electron beam deposition or resistant heating deposition may be adopted. Meanwhile, for the formatting of $SiO_2$ layer 14 and electric current block layer 11, a method, such as a plasma enhanced chemical vapor deposition (PECVD) method or a sputtering method, may be adopted.

Furthermore, wafer 20 is illustrated as a square wafer in FIG. 4A for simplification; however, it may be configure to manufacture the wafer by using a substantially circular-shaped substrate having an orientation flat surface or a notched part for specifying a crystalline orientation. Alternatively, the wafer may be manufactured by using a perfect circular substrate.

Furthermore, the thickness of substrate 2 is set to 100 μm; however, stacking may be initiated by setting the thickness to approximately 400 μm so as to make handling easier. In such a case, polishing or the like may be carried out by the time when n-side electrode 13 is formed at the latest, and substrate 2 is made thinner so as to achieve the thickness thereof of approximately 100 μm. Here, the use of substrate 2 having a sufficiently large thickness when the individual layers 3 to 8 made essentially of a nitride semiconductor are stacked on substrate 2 is also effective in the case where crack C, which will be described later, is appropriately formed.

(A Dividing Method of a Wafer)

Figure 5A:
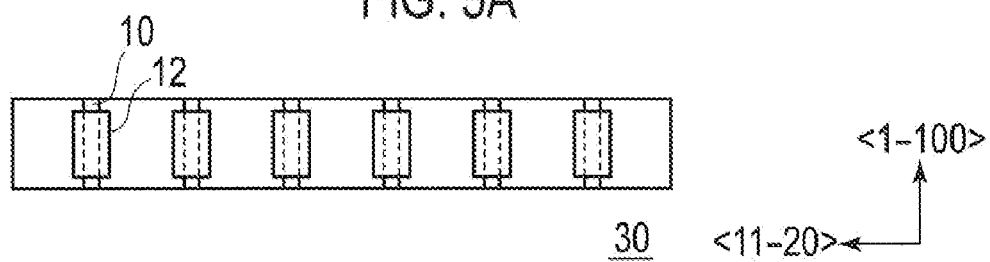
FIG. 5A and FIG. 5B are schematic plan views illustrating configurations of a bar and a chip, respectively.
Figure 5B:

Next, a method of cleaving and dividing wafer 20 illustrated in FIG. 4A and FIG. 4B so as to obtain laser chip 1 illustrated in FIG. 1A and FIG. 1B will be described with reference to FIG. 5A and FIG. 5B. FIG. 5A and FIG. 5B are schematic plan views illustrating the configuration of a bar and a chip, respectively. The plan views respectively illustrated in FIG. 5A and FIG. 5B show the same planar surface as that in FIG. 1A.

As illustrated in FIG. 5A, firstly, wafer 20 illustrated in FIG. 4A and FIG. B is cleaved along <11-20> direction to obtain bar 30. At this time, two end faces (a surface substantially parallel to {1-100} surface) are formed for bar 30 after the cleavage, and these end faces serve as a resonator end face. In the meantime, bar 30 has a configuration in which multiple laser chips are aligned in a line in <11-20> direction.

Thereafter, on the resonator end face of the obtained bar 30, a protection film made essentially of, for example, $SiO_2$, $TiO_2$, $Al_2O_3$, AlN, $ZrO_2$, or the like, is formed. Then, a protection film formed on one end face is made with multiple layers of, for example, approximately 10 so as to have a high reflectivity, while a protection film formed on the other end face is made with a small number of layers of, for example, approximately 1, so as to have a low refractivity. Then, as illustrated in FIG. 5B, the obtained bar 30 is divided along <1-100> direction to obtain laser chip 1.

Here, in the cleaving of wafer 20 to obtain bar 30 and the dividing of bar 30 to obtain chip 1, a groove along the cleaving direction and the dividing direction may be formed in wafer 20 or bar 30, and then the cleaving or the dividing may be carried out along the groove. Then, the groove may be a solid line or a broken line, and may be formed by using a diamond point or a laser. Moreover, a groove may be formed on a surface on which pad electrode 12 and electric current block layer 11 are formed on wafer 20 and bar 30, or that a groove is formed on a surface on which n-side electrode 13 is formed.

(Laser Device)

Figure 6:
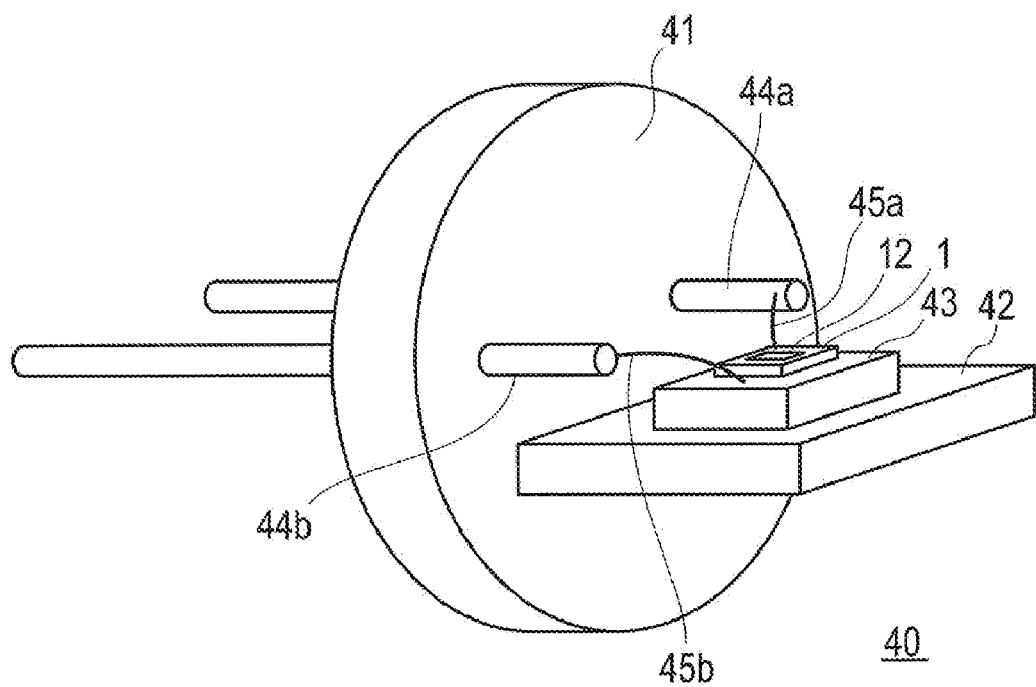
FIG. 6 is a schematic perspective view illustrating an example of a nitride semiconductor laser device.

Next, an example of a laser device having laser chip 1 illustrated in FIG. 1 will be described with reference to FIG. 6. FIG. 6 is a schematic perspective view illustrating an example of a laser device. As illustrated in FIG. 6, laser device 40 includes: submount 43 to which laser chip 1 is connected and mounted by soldering; heat sink 42 that is connected to submount 43; stem 41 having a predetermined surface to which heat sink 42 is connected; pins 44a and 44b that penetrate from the predetermined surface of stem 41 to a surface thereof opposite to the predetermined surface and be provided so as to be insulated from stem 41; wire 45a that electrically connects pin 44a and pad electrode 12 of laser chip 1; wire 45b that electrically connects pin 44b and submount 43.

Here, although not illustrated in the drawing so as to clearly display the configuration of laser device 40, a cap is provided, which is connected to the predetermined surface of stem 41, and to seal laser chip 1, submount 43, heat sink 42, parts of pins 44a and 44b, which projects from the predetermined surface of stem 41, and wires 45a and 45b.

Then, when an electric current is supplied to laser chip 1 through these two pins 44a and 44b, laser chip 1 oscillates and emits a laser beam. Here, the cap is provided with a window made essentially of a material transparent to the emitted laser light, and the laser light is emitted through the window.

Note that, the configuration of laser device 40 illustrated in FIG. 6 is merely an example, and a laser device in the embodiment of the invention is not limited to this configuration. For example, a detector that is made with a photodiode and detects an output of emitted light may be provided, and a detection result is fed back to a power supply apparatus so that a constant amount of light can be output from laser chip 1. In the meantime, laser chip 1 may have a structure in which three pins are provided, and one is used as a common pin between the detector and laser chip 1 while remaining two are respectively connected to laser chip 1 and the detector.

<Configuration of a Crack>

Figure 7:
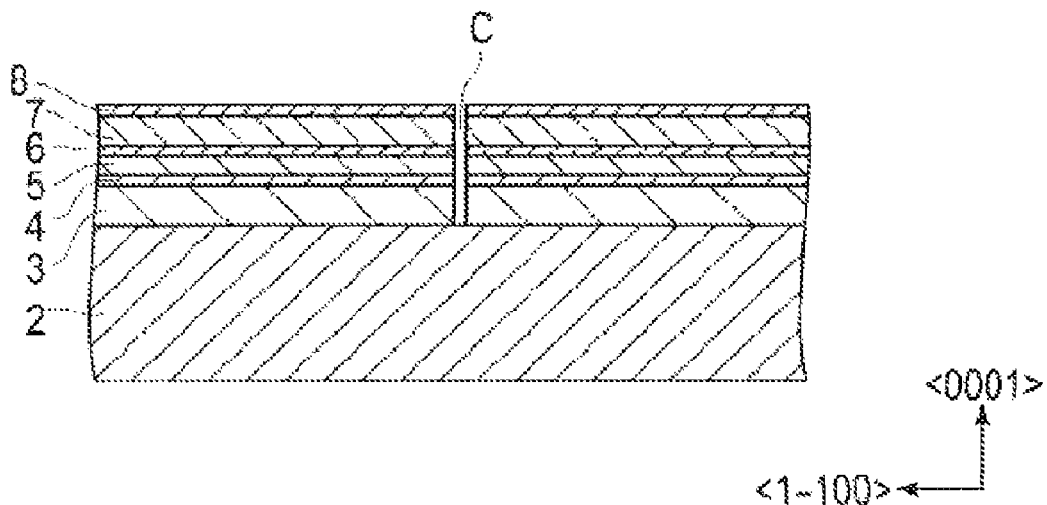
FIG. 7 is a schematic cross-sectional view illustrating a configuration of a crack.

Laser chip 1 in the embodiment is, as illustrated in FIG. 1A, provided with crack C formed therein. Hereinafter, a description will be given of crack C. Firstly, a configuration of crack C will be described with reference to FIG. 7. FIG. 7 is a schematic cross-sectional view illustrating the configuration of crack C. Here, FIG. 7 shows the same configuration as that in FIG. 2A, and shows <0001> direction as a vertical direction and <1-100> direction as a horizontal direction. In other words, FIG. 7 shows a cross section that is substantially perpendicular to FIG. 2A.

As described above, after stacking the individual layers 3 to 8 made essentially of a nitride semiconductor, it is confirmed whether crack C has been formed. At this time, the bottom end of crack C reaches substrate 2 as illustrated in FIG. 7. Then, as illustrated in FIG. 1A, crack C is formed so as to go from one end part of laser chip 1 and reach other end thereof along <11-20> direction. In other words, as described above, crack C has a flat-plate shape that is substantially parallel to the resonator end face.

Here, although the width of crack C in <1-100> direction, that is, the length corresponding to the flat plate thickness, may vary relative to <0001> direction, the size is approximately in a range from 0.1 μm to 2 μm; therefore, crack C is minute.

Figure 8:
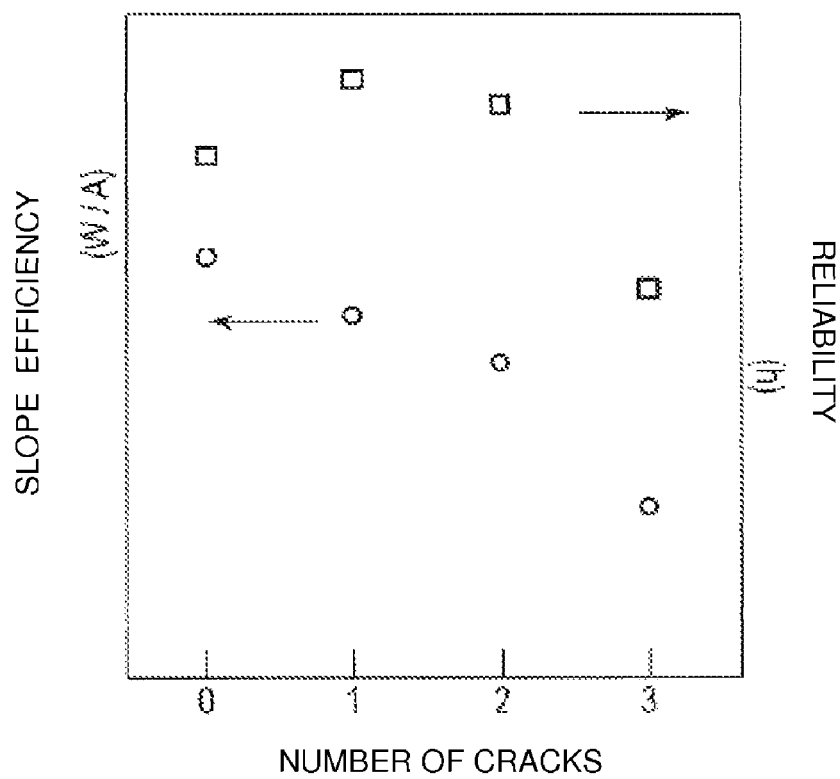
FIG. 8 is a graph showing a result of an operation test of nitride semiconductor laser devices in an embodiment.

A result of an operation test of a nitride semiconductor laser device mounted with laser chip 1 having crack C formed therein is shown in FIG. 8. FIG. 8 is a graph showing a result of an operation test of a nitride semiconductor laser device in the embodiment, and shows a relative result with the number of cracks formed in a lateral axis and slope efficiency and reliability in a longitudinal axis. In FIG. 8, an outline circle represents a plot of slope efficiency, and an outline square represents a plot of reliability. Here, reliability indicates mean time to failure (MTTF). In the present example, the mean time to failure indicates a time, which guarantees that 67% of laser device can operate without failure in the case where an output is set to 10 mW and an operation temperature is set to 75° C.

As shown in FIG. 8, when the number of cracks C formed is increased, the slope efficiency is lowered. In other words, light-emitting efficiency is lower when the number of cracks C formed is higher. However, in the case where only one or two cracks C are formed, it is still possible to improve the reliability compared to the case where no crack C is formed. To be more specific, the degree of the effect of improving the reliability by relief of stress due to strain, which is enabled by introduction of crack C, can be larger than the degree of deterioration of the reliability due to the decrease in the light-emitting efficiency. As a result, it is possible to improve the reliability.

Therefore, by having a configuration in which at least one, preferably one or two, crack C is formed, it is possible to improve the reliability compared to the case where no crack C is formed. Especially, in the case in FIG. 8 where one crack C is formed and the reliability is best improved, it is possible to achieve 5000 hours of reliability.

Note that, the graph shown in FIG. 8 is an example, and the reliability in the case where more than 2 cracks C are formed may be better than the reliability in the case where no crack C is formed. However, it is preferable to have one or two cracks C because the effect of improving the reliability can be more surely obtained.

Furthermore, the example is shown in which crack C reaches substrate 2 in <0001> direction; however, crack C may not completely reach substrate 2. Even in the case crack C does not completely reach substrate 2, the effect of releasing stress due to strain can be obtained.

Here, the crystalline structure of the above-described nitride semiconductor is a wurtzite structure, and therefore is a 6-fold symmetric structure. Accordingly, in {0001} plane, there are a total of six equivalent directions expressed in <11-20> direction, which is the cleaving direction, at every 60°. Therefore, crack C is likely to be formed in these equivalent directions, and crack C may be formed in a direction not substantially parallel to the resonator end face in some cases. Furthermore, when crack C that is substantially parallel to the resonator end face and crack C, which is displaced by 60° are alternately generated, a zigzag crack may be formed, which is at an angle other than 60° to the resonator end face as a whole.

Even when such cracks are formed, it is still possible to obtain the above-described effect of releasing the strain. However, since a crack is not a surface substantially perpendicular to <1-100> direction in which light reciprocates, unintended refraction or reflection may be caused at the crack. Therefore, it is preferable that crack C, as illustrated in FIG. 1A, having a surface substantially parallel to <1-100> direction in which light reciprocates be formed.

On the other hand, even in the case where a zigzag crack is formed of the mixture of crack C and a crack displaced by 60°, for example, the surface of the crack at a part in which light mainly reciprocates may be substantially parallel to <1-100>. In such a case, even if the whole crack is not substantially perpendicular to <1-100>, the effect of improving the reliability can be obtained.

Furthermore, the application of the present invention is not limited to a nitride semiconductor laser device, which emits a laser beam having a blue or ultraviolet wavelength. For example, the present invention can be applied to a nitride semiconductor laser device, which has a high In composition of InGaN in well layer 4a of active layer 4 and therefore outputs light having a green wavelength.

<Method of Forming Crack>

A concrete example of a method of efficiently forming the above-described crack will be described hereinafter. Firstly, an Al composition of AlGaN used for n-type cladding layer 3 and p-type cladding layer 7 will be described.

When an Al composition is changed, characteristics of AlGaN, such as the length of an a-axis and the heat expansion coefficient, can be changed. Accordingly, it is possible to control the density of crack C to be formed. In the present example, it is preferable to set the value in a range, for example, from 6% to 8%. Furthermore, it is more preferable to set the value to approximately 7%. Here, the Al composition is confirmed on the basis of a measurement result of X-ray diffraction. To be more specific, diffraction on (0006) symmetry plane is measured, and then the size of crystal lattice is calculated based on the measurement result and the Al composition is determined.

In the meantime, it is also possible to control stress generated within a crystal and resistance against the stress so as to efficiently form crack C by selecting the thickness of the individual layers 3 to 8, which are made essentially of a nitride semiconductor and grown on substrate 2 and the thickness of substrate 2. For example, there is a method of controlling the density of crack C by adjusting the total thickness of the layers 3 to 8, which are made essentially of a nitride semiconductor and stacked on substrate 2. In this case, it is preferable to set the whole thickness to be in a range, for example, approximately from 2 μm to 6 μm. Furthermore, it is more preferable to set the value in a range approximately from 3.0 μm to 5.0 μm. Furthermore, in the case where the thickness is set to be in these ranges, it is preferable that the thickness of substrate 2 on which the individual layers 3 to 8 made essentially of a nitride semiconductor are stacked be set to 90 μm or above.

By adopting the above-described method, it is possible to form crack C without increasing a special work process for forming crack C. Especially, since it is only required that only parameters, such as thickness, are controlled, crack C can be easily formed. Therefore, it is possible to obtain nitride semiconductor laser chip 1 having a high reliability by an easy and simple method.

Note that, the parameters described above are merely an example, and crack C may be formed by adjusting other parameters than the above parameters. For example, crack C may be formed by accordingly selecting a temperature when the individual layers 3 to 8 made essentially of a nitride semiconductor are stacked, or a material used for substrate 2 or a crystallinity thereof. Furthermore, crack C may be formed by performing annealing processing at a predetermined temperature after the stacking of the individual layers 3 to 8 or other following processes.

Furthermore, as a concrete method of preferentially forming crack C in a direction substantially parallel to the resonator end face, there is a method, for example, in which a substrate having multiple high defect density regions formed therein extending in <1-100> direction is used. Such a substrate can be manufactured by a method, for example, an epitaxial lateral over growth (ELOG) method or the like. When laser chip 1 is manufactured by using the substrate, crack C can be easily formed, which is substantially perpendicular to <1-100> direction. Here, in the case of using such a substrate, ridge part 10 may be formed away from a part right above the high defect density regions.

Furthermore, crack C may be formed by applying predetermined processing (for example, irradiation of various beams, application of stress, or the like) to the individual layers 3 to 8, which are made essentially of a nitride semiconductor and have no crack C formed therein. Alternatively, a place in which crack C can be easily formed may be intentionally made by performing predetermined processing (for example, processing of altering a crystal in a part in which crack C is to be formed, or the like) on substrate 2, and a position at which crack C is to be formed is controlled. Although these methods include more processes than the above-described method, it is possible to more accurately control crack C.

The present invention relates to a nitride semiconductor laser chip, a manufacturing method thereof, and a nitride semiconductor laser device having a nitride semiconductor laser chip. It is preferable that the present invention be applied to a semiconductor laser chip or the like manufactured by stacking a nitride semiconductor on a nitride semiconductor substrate.

As described above, according to the nitride semiconductor laser chip and the manufacturing method thereof and the nitride semiconductor laser device of the embodiment, it is possible to relieve stress due to strain within the nitride semiconductor laser chip and improve the reliability thereof.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A nitride semiconductor laser chip comprising:
   a substrate;
   a laminated structure provided on a main surface of the substrate and including a nitride semiconductor layer; and
   at least one crack in the laminated structure wherein the crack is provided substantially perpendicular to directions in which light generated within the laminated structure reciprocates, and wherein the crack relieves stress due to the strain of crystal lattice.

2. The nitride semiconductor laser chip of claim 1, wherein the crack has a flat plate-like shape perpendicular to the main surface of the substrate.

3. The nitride semiconductor laser chip of claim 1, wherein the crack reaches from one end of the laminated structure to the other end thereof.

4. The nitride semiconductor laser chip of claim 1, wherein the crack has a width in a range from 0.1 µm to 2 µm, inclusive.

5. The nitride semiconductor laser chip of claim 1, wherein the laminated structure comprises an Al-doped layer made essentially of AlGaN.

6. The nitride semiconductor laser chip of claim 5, wherein the Al-doped layer of the laminated structure has an Al composition in a range from 6% to 8%, inclusive.

7. A nitride semiconductor laser chip comprising:
a substrate;
a laminated structure provided on a main surface of the substrate and including a nitride semiconductor layer; and
at least one crack in the laminated structure wherein the crack is provided substantially parallel to a resonator end face and wherein the crack has a flat plate-like shape perpendicular to the main surface of the substrate, and wherein the crack relieves stress due to the strain of crystal lattice.

8. The nitride semiconductor laser chip of claim 7, wherein the crack has a flat plate-like shape perpendicular to the main surface of the substrate.

9. The nitride semiconductor laser chip of claim 7, wherein the crack reaches from one end of the laminated structure to the other end thereof.

10. The nitride semiconductor laser chip of claim 7, wherein the crack has a width in a range from 0.1 µm to 2 µm, inclusive.

11. The nitride semiconductor laser chip of claim 7, wherein the laminated structure comprises an Al-doped layer made essentially of AlGaN.

12. The nitride semiconductor laser chip of claim 11, wherein the Al-doped layer of the laminated structure has an Al composition in a range from 6% to 8%, inclusive.

13. A nitride semiconductor laser chip comprising:
a substrate;
a laminated structure provided on a main surface of the substrate and including a nitride semiconductor layer; and
at least one crack in the laminated structure, wherein the crack has a first crack part that is substantially parallel to a resonator end face and a second crack part that is displaced by 60° from the resonator end face.

14. The nitride semiconductor laser chip of claim 13, wherein the first crack part and the second crack part are alternately generated, so that the crack has a zigzag shape making as a whole an angle other than 60° with the resonator end face.

15. A manufacturing method of a nitride semiconductor laser chip, comprising:
forming a laminated structure including a nitride semiconductor layer on a surface of the substrate; and
forming at least one crack in the laminated structure, wherein the crack is provided substantially perpendicular to directions in which light generated within the laminated structure reciprocates, and wherein the crack relieves stress due to the strain of crystal lattice.

16. The manufacturing method of claim 15, wherein the crack is provided substantially parallel to a resonator end face.

17. The manufacturing method of claim 15, wherein
the crack has a flat plate-like shape perpendicular to the main surface of the substrate.

18. The manufacturing method of claim 15, wherein the crack reaches from one end of the laminated structure to the other end thereof.

19. The manufacturing method of claim 15, wherein the crack has a width in a range from 0.1 µm to 2 µm, inclusive.

20. The manufacturing method of claim 16, wherein the crack reaches from one end of the laminated structure to the other end thereof.

* * * * *